(12) United States Patent
Lesso (10) Patent No.: US 11,601,760 B2
(45) Date of Patent: Mar. 7, 2023

(54) LOUDSPEAKER DRIVER SYSTEMS

(71) Applicant: Cirrus Logic International Semiconductor Ltd., Edinburgh (GB)

(72) Inventor: John P. Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/579,283

(22) Filed: Jan. 19, 2022

(65) Prior Publication Data
US 2022/0141593 A1 May 5, 2022

Related U.S. Application Data (63) Continuation of application No. 17/163,175, filed on Jan. 29, 2021, now Pat. No. 11,272,293, which is a continuation-in-part of application No. 16/777,172, filed on Jan. 30, 2020, now Pat. No. 10,945,069.

(51) Int. Cl.
| | | |
|---|---|---|
| *H04R 9/06* | (2006.01) | |
| *H03H 17/06* | (2006.01) | |
| *H03K 5/13* | (2014.01) | |
| *H03K 5/1534* | (2006.01) | |
| *H03F 3/217* | (2006.01) | |

(52) U.S. Cl.
CPC .............. *H04R 9/06* (2013.01); *H03H 17/06* (2013.01); *H03K 5/13* (2013.01); *H03K 5/1534* (2013.01); *H03F 3/2171* (2013.01); *H03F 2200/03* (2013.01)

(58) Field of Classification Search
CPC ... H04R 9/06; H03H 7/06; H03K 5/13; H03K 5/1534; H03F 3/2171; H03F 2200/03
See application file for complete search history.

(56) References Cited

U.S. PATENT DOCUMENTS

| | | | |
|---|---|---|---|
| 9,276,540 B2 | 3/2016 | Yasuda et al. | |
| 10,945,069 B1 | 3/2021 | Lesso | |
| 11,272,293 B2 * | 3/2022 | Lesso | ........... H03K 5/1565 |
| 2013/0342254 A1 | 12/2013 | Mazumder et al. | |
| 2016/0044402 A1 | 2/2016 | Okamura et al. | |
| 2016/0134268 A1 | 5/2016 | Onodera | |

FOREIGN PATENT DOCUMENTS

| | | |
|---|---|---|
| EP | 0167157 A2 | 1/1986 |
| JP | H04355599 A | 12/1992 |
| JP | 10290492 | 10/1998 |

OTHER PUBLICATIONS

English translation of JP 10-290492, Toshitaka, 1998.
(Continued)

*Primary Examiner* — Andrew L Sniezek
(74) *Attorney, Agent, or Firm* — Jackson Walker L.L.P.

(57) ABSTRACT

A system for driving a transducer having a plurality of coils, the system comprising: a modulator for outputting a digital output signal representative of a received analogue input signal at a modulator output; a clock controlled delay element for applying a delay to the digital output signal to generate a first delayed signal at a delay element output; wherein the modulator output is couplable to a first coil of the plurality of the coils of the transducer and the delay element output is couplable to a second coil of the plurality of coils of the transducer.

5 Claims, 10 Drawing Sheets

(56) References Cited

OTHER PUBLICATIONS

International Search Report and Written Opinion of the International Searching Authority, International Application No. PCT/GB2021/050178, dated May 18, 2021.

Invitation to Pay Additional Fees, Partial International Search Report, and Provisional Opinion of the International Searching Authority, International Application No. PCT/GB2021/050178, dated Mar. 26, 2021.

Combined Search and Examination Report under Sections 17 and 18(3), UKIPO, Application No. GB2018686.2, dated Mar. 18, 2021.

* cited by examiner

LOUDSPEAKER DRIVER SYSTEMS

RELATED APPLICATION

The present disclosure is a continuation of U.S. Non-Provisional patent application Ser. No. 17/163,175, filed Jan. 29, 2021, which is a continuation-in-part of U.S. Non-Provisional patent application Ser. No. 16/777,172, filed Jan. 30, 2020, issued as U.S. Pat. No. 10,945,069 on Mar. 9, 2021, each of which is incorporated by reference herein in its entirety.

FIELD OF THE INVENTION

The present disclosure relates to the field of loudspeaker driver systems. In particular, the present disclosure relates to a system and method for driving a loudspeaker that has a plurality of coils.

BACKGROUND

There is a continuing requirement in portable electronic devices such as mobile telephones, tablet and laptop computers, portable speakers, headphones, earphones, earbuds and the like for loudspeaker systems that are capable of producing high volume audio outputs whilst occupying as small a physical volume as possible.

One approach to generating high volume audio outputs in portable electronic devices is to use a boosted power supply to drive a relatively large loudspeaker. However, larger loudspeakers suffer from reduced sensitivity, meaning that an increase in the electrical power input to the loudspeaker does not necessarily result in a corresponding increase in the loudness of the audio output produced by the loudspeaker.

Another approach is to use two loudspeakers mounted in a back to back configuration. Whilst this may increase the loudness of the audio output produced, a disadvantage of this dual loudspeaker arrangement is that the resistances of the loudspeakers are presented to the loudspeaker driver circuitry in parallel. This arrangement also increases (e.g. doubles) the physical volume occupied by the loudspeakers, which can be problematic in small form factor devices which may lack sufficient space for two loudspeakers.

Loudspeakers having a plurality of coils are known. In general such multi-coil loudspeakers are used in one of two different configurations. In a first configuration a loudspeaker includes a plurality of different coils, each of which is responsive to input signals in a different frequency band. In a loudspeaker of this type each coil must be driven by a drive signal carrying frequencies in the frequency band of the coil. One way of achieving this is to encode an input audio signal using a pulse density modulator and to apply appropriate digital filtering to generate a plurality of digital signals corresponding to the respective frequency bands of the coils of the loudspeaker, with each of the plurality of digital signals being used to drive the appropriate one of the loudspeaker coils.

A second multi-coil loudspeaker configuration includes a drive coil for driving the cone of the loudspeaker and a sense coil for sensing the amount of excursion of the loudspeaker cone by detecting a current induced in the sense coil as a result of movement of the loudspeaker cone. Loudspeakers of this type are typically coupled to speaker protection systems which monitor the amount of excursion of the speaker cone, as detected by the sense coil, and limit the amplitude of the signal that drives the drive coil in the event that over-excursion of the cone is detected.

A need exists for a system for providing an increase in the loudness of audio output by a single loudspeaker without requiring a boosted power supply.

SUMMARY

According to a first aspect, the invention provides a system for driving a transducer having a plurality of coils, the system comprising:
- a modulator for outputting a digital output signal representative of a received analogue input signal at a modulator output;
- a clock controlled delay element for applying a delay to the digital output signal to generate a first delayed signal at a delay element output;
- wherein the modulator output is couplable to a first coil of the plurality of the coils of the transducer and the delay element output is couplable to a second coil of the plurality of coils of the transducer.

The system may further comprise a clock signal generator operative to generate a clock signal for the clock controlled delay element.

The modulator may comprise a class D amplifier, for example.

The analogue input signal may comprise an audio signal.

The input signal may comprise a digital signal and the modulator may comprise a digital modulator.

The modulator and the delay element may be configured to receive a clock signal.

The clock controlled delay element may comprise a clocked buffer.

The clock controlled delay element may alternatively comprise a counter.

The clock controlled delay element may further comprise an edge detector and an edge generator, wherein:
- the edge detector is configured to detect an edge of an input PWM signal and to trigger the counter on detection of the edge;
- the counter is configured to count pulses of the clock signal until a predetermined number is reached and to output a signal to the edge generator when the predetermined number is reached; and
- the edge generator is configured to output a delayed and inverted version of the input PWM signal as an output PWM signal in response to receiving the signal from the counter.

The delay element may be configured to apply a delay equal to one period of the output PWM signal to the output PWM signal.

The clock controlled delay element may form at least part of a finite impulse response (FIR) filter arrangement.

The FIR filter arrangement may be configured to receive a configuration signal and, based on the configuration signal, to adapt in response to a variation in a frequency of the PWM output signal output.

The FIR filter arrangement may be operative, in response to the configuration signal, to adjust a predetermined value used by a counter of the FIR filter arrangement.

The FIR filter arrangement may be configured to suppress a carrier of the PWM output signal.

The FIR filter arrangement may be configured to provide a zero at a carrier frequency of the PWM output signal.

A carrier frequency of a PWM output signal output by the modulator may be modulated based on a control signal.

The control signal may be based on an operating mode of the system or on an input signal level of the input signal.

According to a second aspect the invention provides an integrated circuit comprising a system according to the first aspect.

According to a third aspect the invention provides a device comprising a system according to the first aspect, wherein the device comprises a portable device, battery powered device, a mobile telephone, a notebook, laptop or tablet computing device, a smartwatch or an accessory device.

According to a fourth aspect the invention provides a system for driving a transducer, the system comprising:
- a modulator for outputting a digital output signal representative of a received analogue input signal at a modulator output;
- a delay element for applying a delay to the digital output signal to generate a first delayed signal at a delay element output;
- a first inductor having a first terminal coupled to the modulator output; and
- a second inductor having a first terminal coupled to the delay element output,
- wherein a second terminal of the first inductor is coupled to a second terminal of the second inductor to provide an output node for a drive signal to drive the transducer.

The first inductor and the second inductor may comprise first and second coils of the transducer.

The transducer may comprise a loudspeaker, for example.

According to a fifth aspect the invention provides a module comprising the system of the fourth aspect and a transducer.

According to a sixth aspect the invention provides an integrated circuit according to the fourth aspect.

BRIEF DESCRIPTION OF THE DRAWINGS

Embodiments of the invention will now be described, strictly by way of example only, with reference to the accompanying drawings, of which.

DETAILED DESCRIPTION

Figure 1:
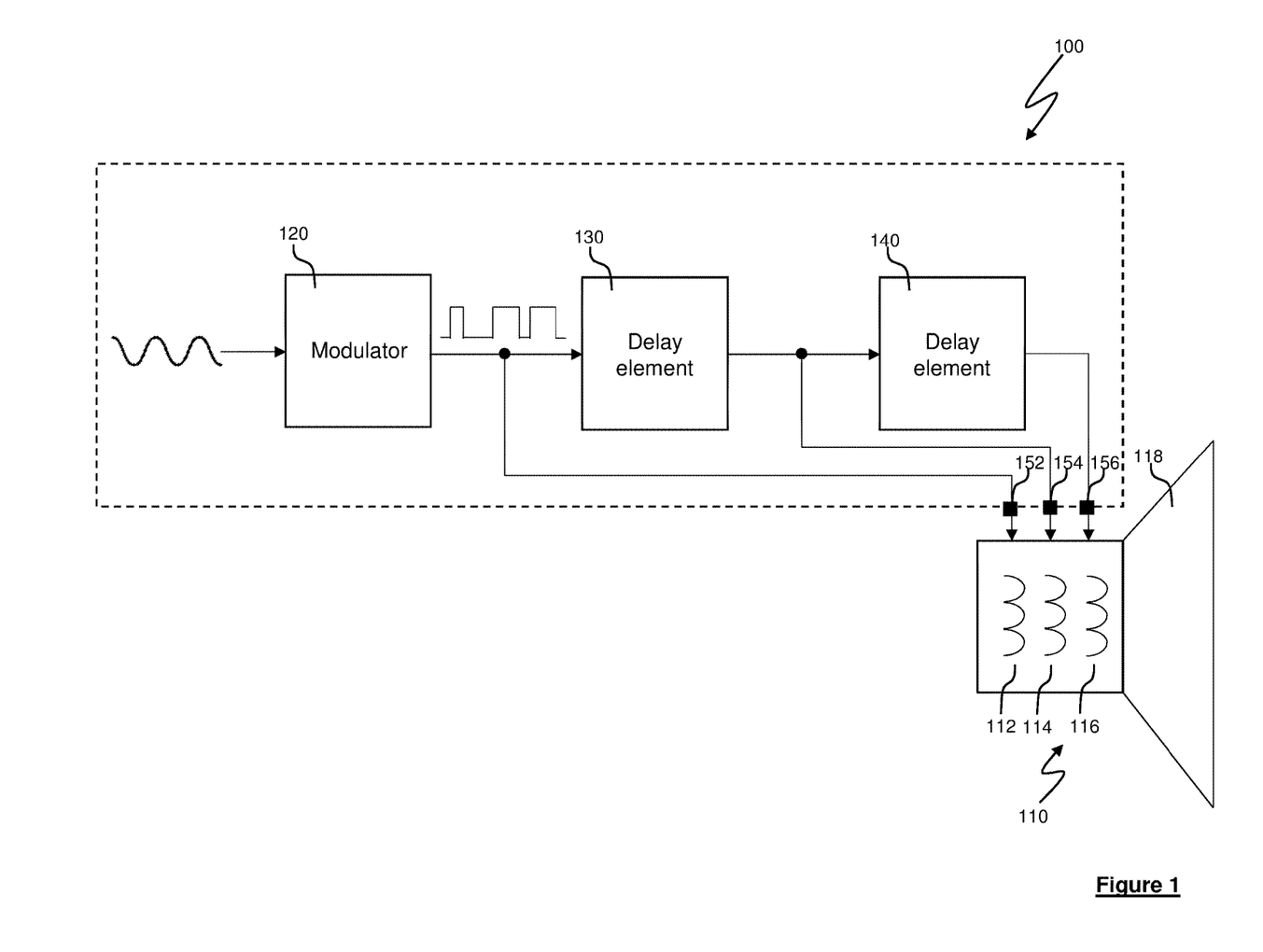
FIG. 1 is a schematic representation of a system for driving a loudspeaker having a plurality of coils.

Referring to FIG. 1, a system for driving a loudspeaker having a plurality of coils (also referred to as a multi-coil loudspeaker) is shown generally at 100. The system 100 illustrated in FIG. 1 is configured to drive a loudspeaker 110 having first, second and third coils 112, 114, 116, but it will be appreciated that the principles described here are applicable to multi-coil loudspeakers having any number of coils.

The system 100 includes a modulator 120 which is configured to receive an analogue input signal such as an audio signal and convert it to a pulse width modulated (PWM) output signal. The modulator 120 may be a class D modulator, for example. The modulator 120 may be implemented, for example, in circuitry (e.g. discrete circuitry or integrated circuitry) or by processing circuitry (e.g. a digital signal processor) executing appropriate software code.

An output of the modulator 120 is coupled to an input of a first delay element 130 such that the PWM signal output by the modulator 120 is input to the first delay element 130. The output of the modulator 120 is also connected to a first output terminal 152 of the system 100, which is configured to be coupled to the first coil 112 of the loudspeaker 110, such that the PWM signal that is output by the modulator 120 is also input to the first coil 112 of the loudspeaker 110 when the loudspeaker is coupled to the system 100.

The first delay element 130 is configured to apply a delay to the input PWM signal and to output a delayed version of the PWM signal.

An output of the first delay element 130 is coupled to an input of a second delay element 140 such that the delayed version of the PWM signal output by the first delay element 130 is input to the second delay element 140. The output of the first delay element 130 is also connected to a second output terminal 154 that is configured to be coupled to the second coil 114 of the loudspeaker 110, such that the delayed version of the PWM signal that is output by the first delay element 130 is also input to the second coil 114 of the loudspeaker 110.

The second delay element 140 is configured to apply a further delay to the input PWM signal and to output a further delayed version of the PWM signal. An output of the second delay element 140 is connected to a third output terminal 156 that is configured to be coupled to the third coil 116 of the loudspeaker 110, such that the further delayed version of the PWM signal that is output by the second delay element 140 is input to the third coil 116 of the loudspeaker 110.

The first and second delay elements may be implemented, for example, in discrete or integrated circuitry, or in processing circuitry executing suitable software code. Where the delay elements are implemented in integrated circuitry, they may be integrated with the modulator circuitry in a single integrated circuit (IC), or alternatively may be integrated together as a standalone IC. Alternatively, each delay element may be integrated as a separate IC.

As will be appreciated by those skilled in the art, the combination of the first and second delay elements 130, 140, first, second and third coils 112, 114, 116 and cone 118 of the loudspeaker 110 acts as a FIR DAC (Finite Impulse Response Digital to Analogue Converter), as will now be explained with reference to FIG. 2.

Figure 2:
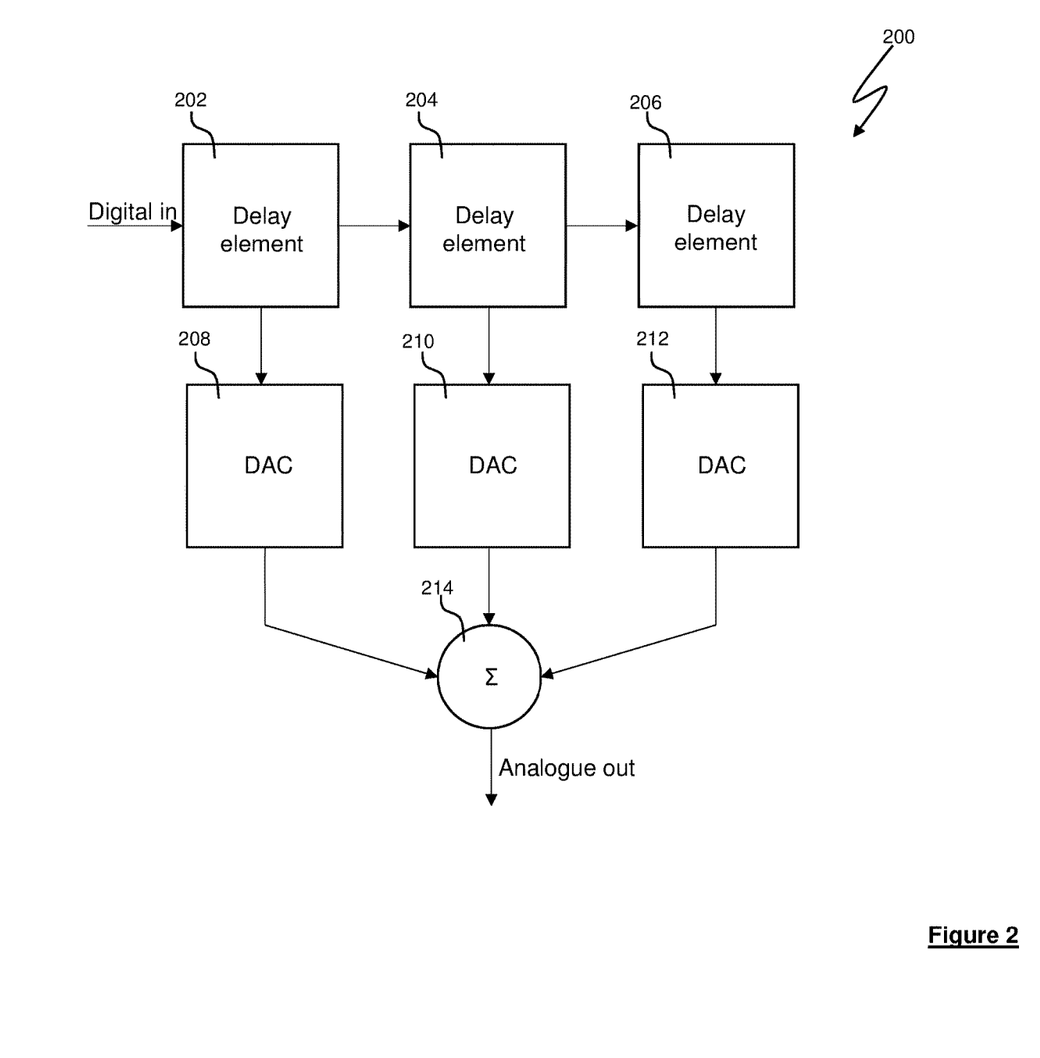
FIG. 2 is a simplified schematic representation of a FIR DAC.

As shown generally at 200 in FIG. 2, a FIR DAC typically comprises a plurality (in this example three) of digital delay elements 202, 204, 206. A first one of the digital delay elements 202 is configured to receive a digital signal at its input, to apply a delay to the received digital signal, and to output a first delayed digital signal to a second one of the digital delay elements 204. The first delayed digital signal is also output to a first digital to analogue converter (DAC) 208.

The second digital delay element 204 is configured to receive the first delayed digital signal at its input, to apply a delay to the received first delayed digital signal, and to output a second delayed digital signal to a third one of the digital delay elements 206. The second delayed digital signal is also output to a second DAC 210.

The third digital delay element 206 is configured to receive the second delayed digital signal at its input, to apply a delay to the received second delayed digital signal, and to output a third delayed digital signal to a third DAC 212.

The first, second and third DACs 208, 210, 212 are configured to convert the received first, second and third delayed digital signals into respective first, second and third analogue signals, and to output the first, second and third analogue signals to a summation unit 214. The summation unit 214 sums the received first, second and third analogue signals and outputs the result of this summation as an analogue output signal.

As will be appreciated, the combination of the digital delay elements 202, 204, 206, the DACs 208, 210, 212 and the summation unit 214 performs the functions of a finite impulse response filter and a digital to analogue converter, such that the analogue output signal constitutes a filtered analogue version of the digital input signal.

In the system 100 of FIG. 1, the delay elements 130, 140 perform the digital delay function of a FIR DAC, whilst the coils 112, 114, 116 of the loudspeaker 110 (in combination with any additional filtering components associated with the coils 112, 114, 116) perform digital to analogue conversion of the digital signals input to the coils 112, 114, 116. The function of summing the analogue signals is performed by the cone 118 of the loudspeaker 110, whose movement is governed by the combination of the magnetic fields generated by the coils 112, 114, 116, and thus outputs an analogue audio signal that represents the sum of the analogue signals generated by the coils 112, 114, 116.

The arrangement of the delay elements 130, 140, the coils 112, 114, 116 and the cone 118 in a FIR DAC configuration helps to reduce the effect of out-of-band signals (i.e. signals outside of the audio frequency band) and jitter in the audio signal output by the loudspeaker 110. For example, the FIR DAC arrangement helps to suppress a carrier signal of the PWM signal output by the modulator 120.

The PWM signal may be generated in a number of different ways. For example, the modulator 120 may be a class D amplifier, as will now be described with reference to FIG. 3.

Figure 3:
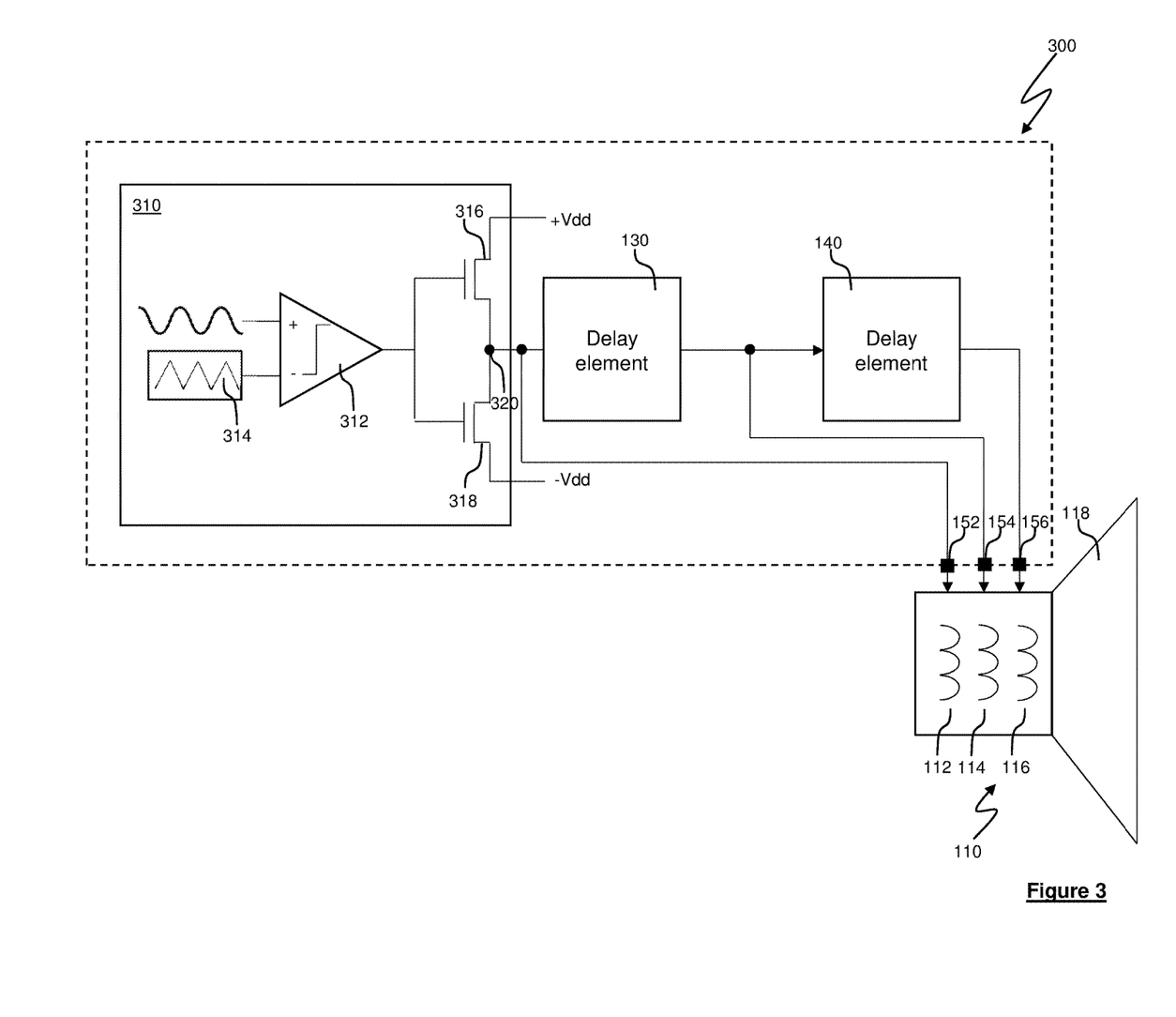
FIG. 3 is a schematic representation of a system for driving a loudspeaker having a plurality of coils which uses a class D amplifier to generate a pulse width modulated signal to drive the coils of the loudspeaker.

The system illustrated in FIG. 3 includes similar components to the system of FIG. 1, so like reference signs have been used to denote like components in FIGS. 1 and 3. The system 300 of FIG. 3 includes a class D amplifier 310, made up of a comparator 312, a carrier signal generator 314, a first switching device 316 and a second switching device 318. The class D amplifier 310 may be implemented as discrete circuitry, or alternatively may be implemented as integrated circuitry. The class D amplifier 310 in this example is configured to receive an analogue input signal and to output at an output 320 thereof a PWM output signal, in a manner that will be familiar to those skilled in the art, but it will be appreciated that a digital class D amplifier could be used where the input signal is a digital signal.

The output 320 of the class D amplifier 310 is coupled to the first delay element 130 and is also connected to a first output terminal 152 of the system 300, which is configured to be coupled to the first coil 112 of the loudspeaker 110, such that the PWM signal that is output by the class D amplifier 310 to the first delay element 130 is also input to the first coil 112 of the loudspeaker 110 when the loudspeaker is coupled to the system 300. The first delay element 130 outputs a first delayed version of the PWM signal that is output by the class D amplifier to a second output terminal 154 that is configured to be coupled to the second coil 114 and to the second delay element 140, and the second delay element 140 outputs a second delayed version of the PWM signal that is output by the class D amplifier to a third output terminal 156 that is configured to be coupled to the third coil 116, as described above with reference to FIG. 1.

Figure 4:
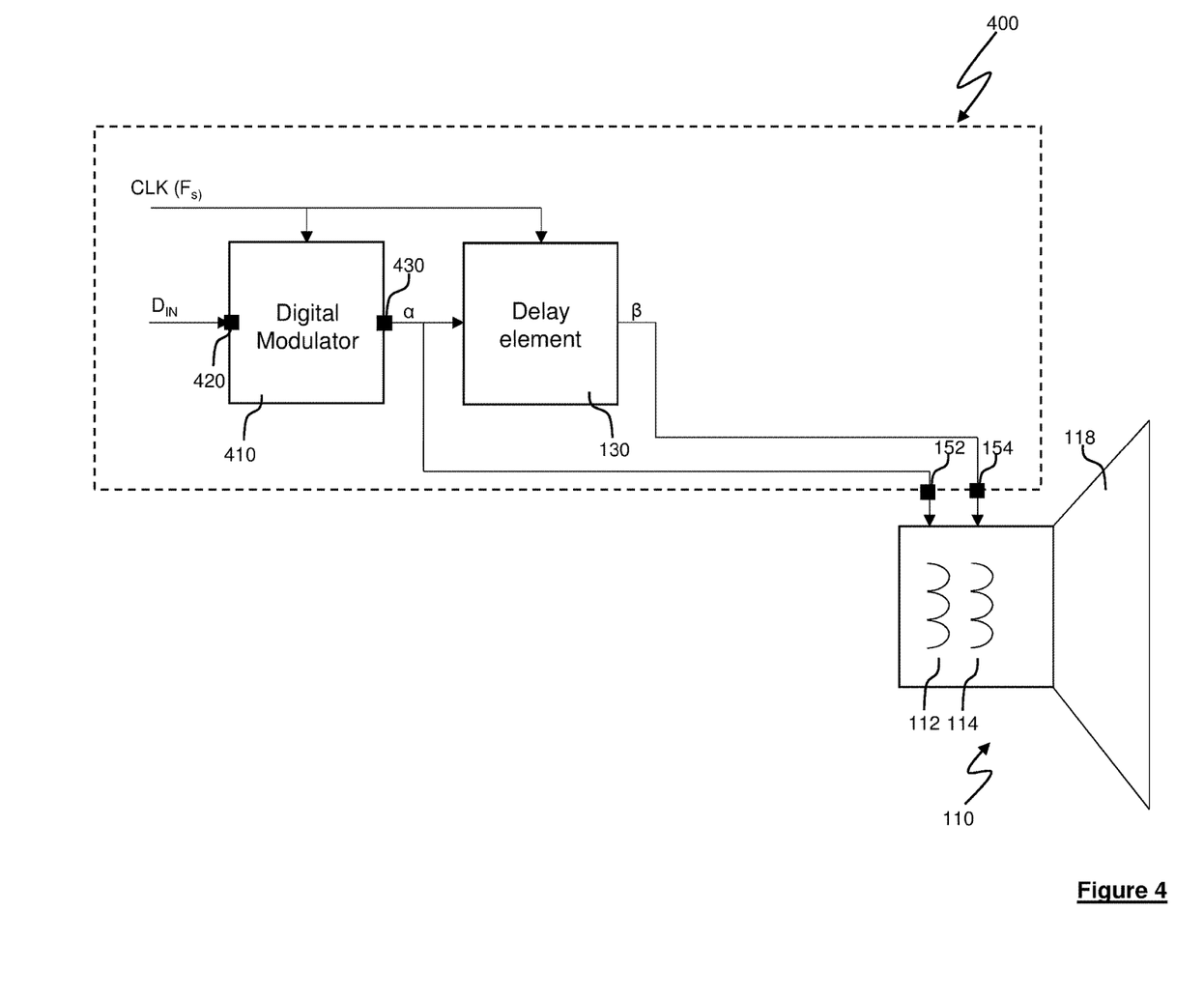
FIG. 4 is a schematic representation of a system for driving a loudspeaker having a plurality of coils which uses a digital modulator to generate a pulse width modulated signal to drive the coils of the loudspeaker.

FIG. 4 is a schematic representation of a system 400 for driving a multi-coil loudspeaker having a plurality of coils which uses a digital modulator to generate a pulse width modulated signal to drive the coils of the loudspeaker. The system illustrated in FIG. 4 includes similar components to the systems of FIGS. 1 and 3, so like reference signs have been used to denote like components in FIGS. 1, 3 and 4.

The system illustrated in FIG. 4 includes a digital modulator 410 having an input 420 and an output 430. A digital input signal DIN (e.g. a digital audio signal) is received at the input 420, and a PWM output signal representing the digital input signal DIN is output at the output 430. The output 430 of the digital modulator 410 is coupled to a first delay element 130 and to a first output terminal 152 of the system 400, which is configured to be coupled to a first coil 112 of a multi-coil loudspeaker 110. The first delay element 130 outputs a first delayed version of the PWM output by the digital modulator 410 to a second output terminal 154, which is configured to be coupled to a second coil 114 of the multi-coil loudspeaker 110.

For simplicity, the loudspeaker 110 is shown as having two coils, but it will be appreciated that the loudspeaker 110 could include more than two coils.

In the system illustrated in FIG. 4, a clock signal CLK with a frequency $F_s$ (generated by a clock of a host device in which the system 400 is provided, for example) is received by the digital modulator 410 and the first delay element 130 to ensure synchronous operation of the digital modulator 410 and the first delay element 130.

In operation of the system a delay β-α between the output 430 (a) of the digital modulator 410 and the output (β) of the first delay element 130 may be large, relative to the frequency $F_s$ of the clock signal CLK. For example, the frequency $F_s$ of the clock signal CLK may be 6.144 MHz, whereas the PWM repetition (carrier) frequency may be 384 kHz. Thus in this example in order to filter the PWM carrier frequency from the output of the first delay element 130 the delay imposed by the first delay element 130 should be one PWM period of the PWM signal output by the digital modulator 410, i.e. 1/384 kHz≈2.6 µs. In the example illustrated in FIG. 4, the first delay element 130 delays the input signal by one PWM period and inverts it.

Figure 5:
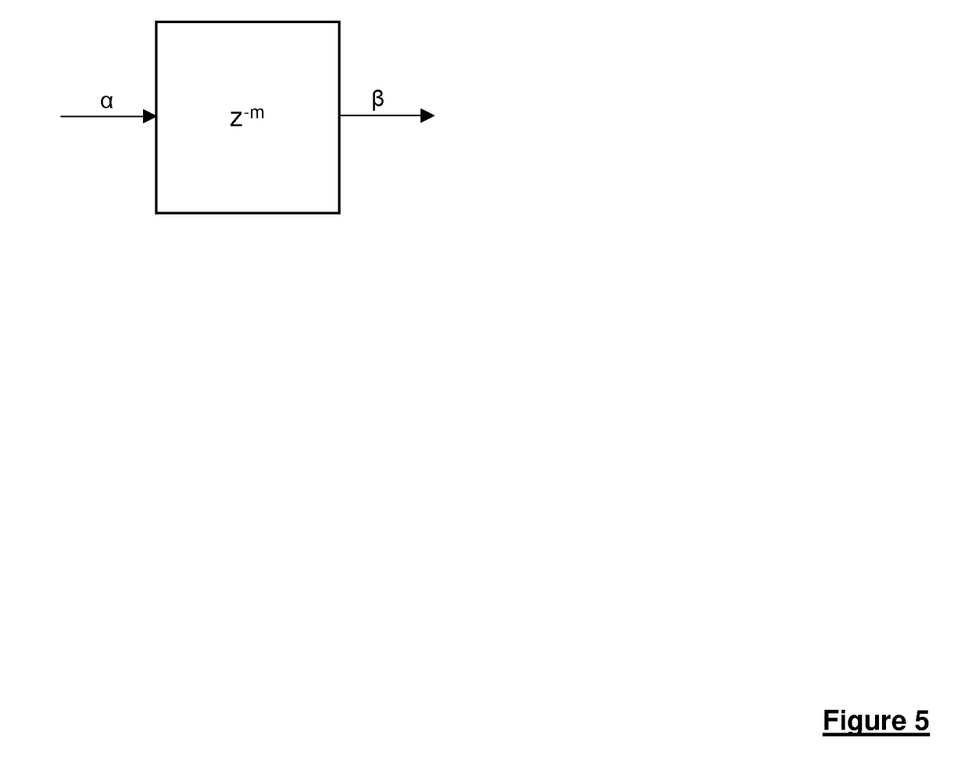
FIG. 5 is a schematic representation of a digital delay unit.

The delay elements 130, 140 described above may be implemented in a number of different ways. In one example, illustrated in FIG. 5, a simple delay element may comprise one or more clocked buffers.

Figure 6:
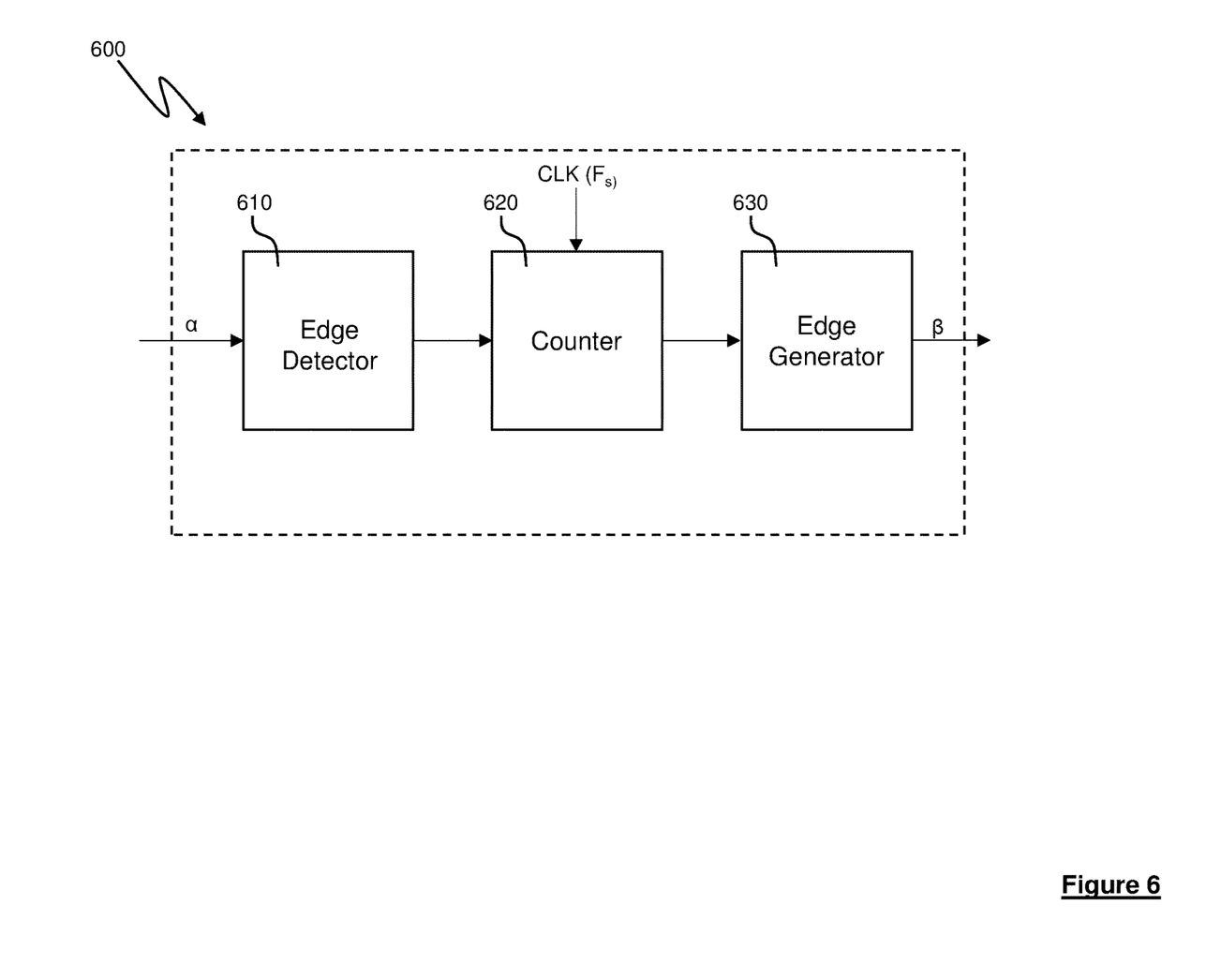
FIG. 6 is a schematic representation of a digital delay implemented using a counter.

Alternatively, a delay element may be more efficiently realised as a counter that counts up to a predetermined number before toggling the output. FIG. 6 is a schematic representation of such a delay element.

The delay element 600 of FIG. 6 is a digital delay element that comprises an edge detector 610, a counter 620 and an edge generator 630.

The edge detector 610 is configured to receive an input PWM signal (e.g. the PWM signal output by the modulator 120, 310 or 410 of FIG. 1, 3 or 4). On detection of an edge of the input PWM signal, e.g. a rising edge, the edge detector 610 outputs a signal to the counter 620 to cause the counter 620 to commence counting clock pulses of the clock signal CLK. The counter 620 continues counting pulses until a predetermined number, equal to the number of clock pulses in one period of the input PWM signal (e.g. 2.6 µs×6.144 MHz=16) has been reached.

For example, where the PWM repetition frequency is 384 kHz and the frequency $F_s$ of the clock signal CLK is 6.144 MHz as described above, one period of the PWM signal will last approximately 2.6 µs, so the predetermined number of clock pulses is 16 (i.e. 2.6 µs×6.144 MHz=16).

When the predetermined number has been reached a signal is output by the counter 620 to the edge generator 630, which outputs an inverted and delayed version of the input PWM signal as an output PWM signal. For example, where the counter 620 was triggered by detection of a rising edge of the input PWM input signal, the edge generator 630 will output a delayed version of the input PWM signal commencing with a falling edge as the output PWM signal.

In general the PWM repetition frequency may be varied. For example, the PWM repetition frequency may be reduced to save power when the modulator is idling. The delay element(s) which make up the FIR filter of the system may thus be reconfigurable to adapt to different PWM repetition frequencies.

Figure 7:
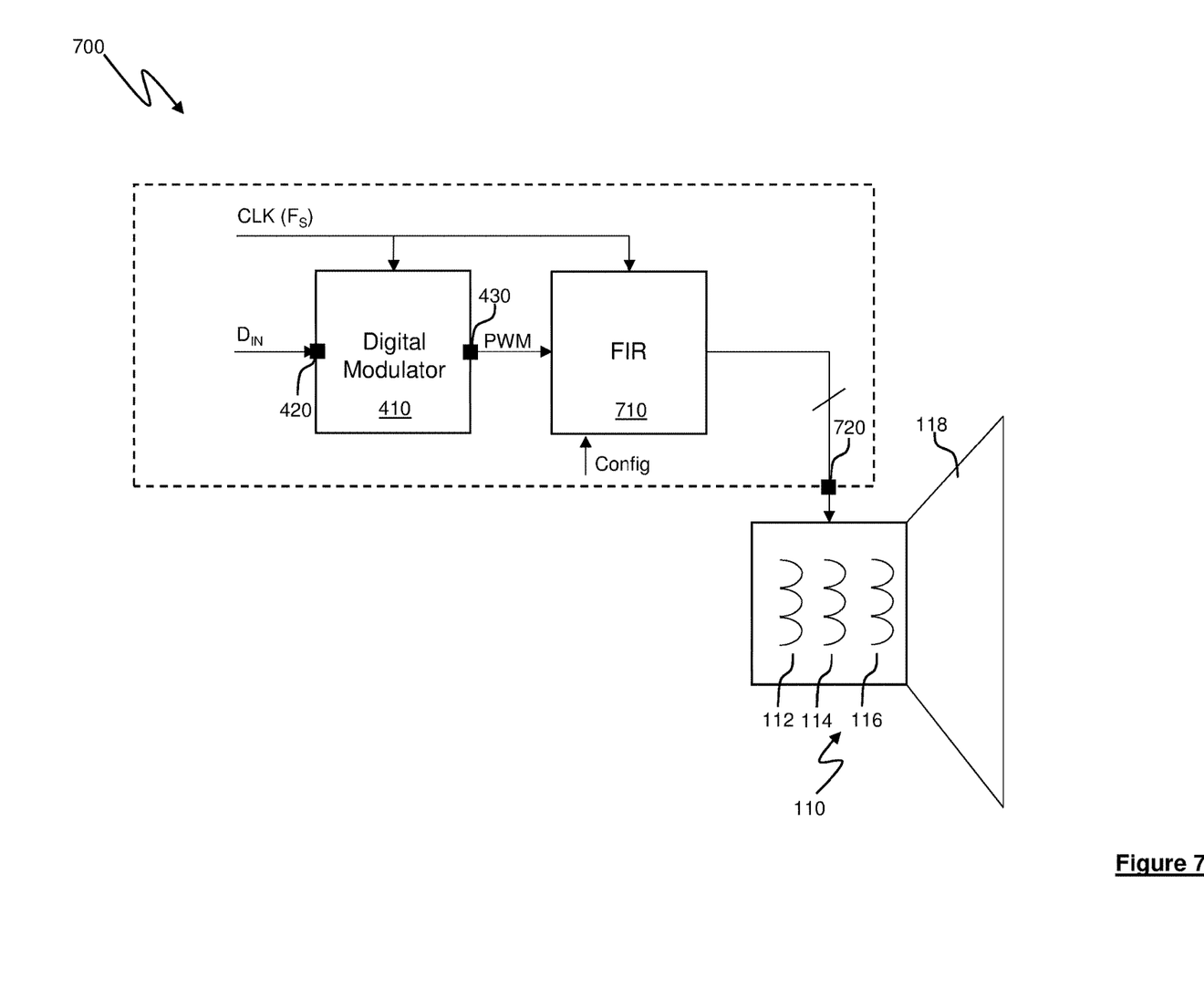
FIG. 7 is a schematic representation of a system for driving a loudspeaker having a plurality of coils which uses a digital modulator to generate a pulse width modulated signal to drive the coils of the loudspeaker, in which a PWM repetition signal is variable.

FIG. 7 is a schematic representation of a system 700 for driving a multi-coil loudspeaker which uses a digital modulator to generate a pulse width modulated signal to drive the coils of the loudspeaker, in which a PWM repetition signal is variable. The system 700 illustrated in FIG. 7 includes similar components to the system of FIG. 4, so like reference signs have been used to denote like components in FIGS. 4 and 7.

The system 700 of FIG. 7 includes a digital modulator 410 of the kind described above with reference to FIG. 4, which outputs a PWM output signal to a FIR filter arrangement 710, which may comprise, for example, one or more delay elements of the kind described above with reference to FIGS. 1-6. The FIR filter arrangement outputs a plurality of signals to output terminals 720 of the system 700, which are configured to be coupled to the coils of a multi-coil loudspeaker 110, each of the plurality of signals driving a different coil 112, 114, 116 of the multi-coil loudspeaker 110.

The FIR filter arrangement 710 receives a configuration signal Config which may be provided, for example, by the digital modulator 410 or by a controller of a host device incorporating the system 700. The configuration signal causes the FIR filter arrangement 710 to adapt or reconfigure in response to a variation in the PWM repetition frequency of the PWM signal output by the digital modulator 410, e.g. by adjusting the predetermined value used by a counter of the FIR filter arrangement, thus to accommodate the variation in the PWM repetition frequency.

The FIR filter arrangement 710 may be optimised to suppress a carrier of the PWM signal. For example the FIR filter arrangement 710 may be configured to provide a zero at the PWM carrier frequency. The PWM carrier frequency may be modulated based on some control signal, which may be based, for example, on an operating mode (e.g. high power/low power) of the system 700 or on an input signal level of the input signal DIN. The FIR filter arrangement 710 is reconfigurable to adapt to changes in the PWM carrier frequency in response to the configuration signal Config.

The discussion above relates to driving a multi-coil loudspeaker. However, those skilled in the art will readily appreciate that the principles discussed above are equally applicable to other multi-coil transducers.

Figure 8:
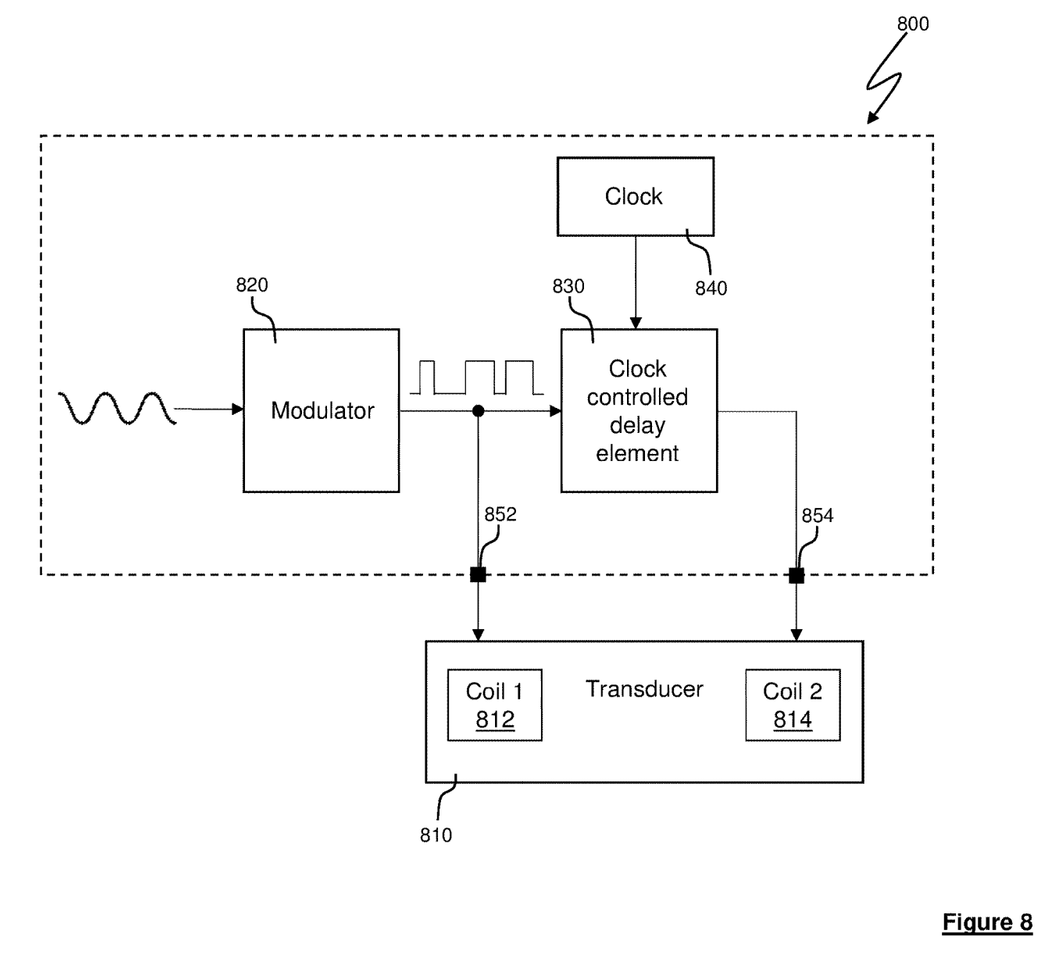
FIG. 8 is a schematic representation of a system for driving a multi-coil transducer.

FIG. 8 is a schematic representation of a system for driving a multi-coil transducer (i.e. a transducer having a plurality of coils). The system 800 illustrated in FIG. 8 is configured to drive a transducer 810 having first and second coils 812, 814, but it will be appreciated that the principles described here are applicable to multi-coil transducers having any number of coils.

The system 800 includes a modulator 820 which is configured to receive an analogue input signal such as an audio signal and convert it to a digital output signal, e.g. a pulse width modulated (PWM) signal. The modulator 820 may be, for example, an asynchronous or self-oscillating PWM modulator. The modulator 820 may be a class D modulator, for example. The modulator 820 may be implemented, for example, in circuitry (e.g. discrete circuitry or integrated circuitry) or by processing circuitry (e.g. a digital signal processor) executing appropriate software code.

An output of the modulator 820 is coupled to an input of a clock controlled delay element 830 such that the digital signal output by the modulator 820 is input to the clock controlled delay element 830. The output of the modulator 820 is also connected to a first output terminal 852 of the system 800, which is configured to be coupled to the first coil 812 of the transducer 810, such that the digital signal that is output by the modulator 820 is also input to the first coil 812 of the transducer 810 when the transducer 810 is coupled to the system 800.

The clock controlled delay element 830 is configured to apply a delay to the input digital signal and to output a delayed version of the digital signal. The clock controlled delay element 830 may comprise, for example, a clocked buffer or a digital delay element of the kind described above with reference to FIGS. 5 and 6.

An output of the clock controlled delay element 830 is coupled to a second output terminal 854 of the system 800, which is configured to be coupled to the second coil 814 of the transducer 810, such that the delayed version of the digital signal output by the modulator 820 that is output by the clock controlled delay element 830 is input to the second coil 814 of the transducer 810.

The system 800 further includes a clock signal generator 840, operative to generate and output a clock signal to the clock controlled delay element 830.

The clock controlled delay element 830 may be implemented, for example, in discrete or integrated circuitry, or in processing circuitry executing suitable software code. Where the clock controlled delay element 830 is implemented in integrated circuitry, it may be integrated with the modulator circuitry in a single integrated circuit (IC), or alternatively may be integrated together as a standalone IC. Alternatively, the clock controlled delay element 830 may be integrated as a separate IC.

In the example illustrated in FIG. 8, one clock controlled delay element 830 is provided, but it will be appreciated that more a plurality of such delay elements could be provided, with an output of each delay element supplying a delayed version of the digital signal output by the modulator 820 to a different coil of a multi-coil transducer.

As will be appreciated by those skilled in the art, the combination of the clock controlled delay element 830 and the first and second 812, 814 coils of the transducer 810 acts as a FIR DAC (Finite Impulse Response Digital to Analogue Converter), in the manner described above with reference to FIG. 2.

The present disclosure also extends to systems (e.g. circuitry) for driving a loudspeaker or other transducer having a single coil.

Figure 9:
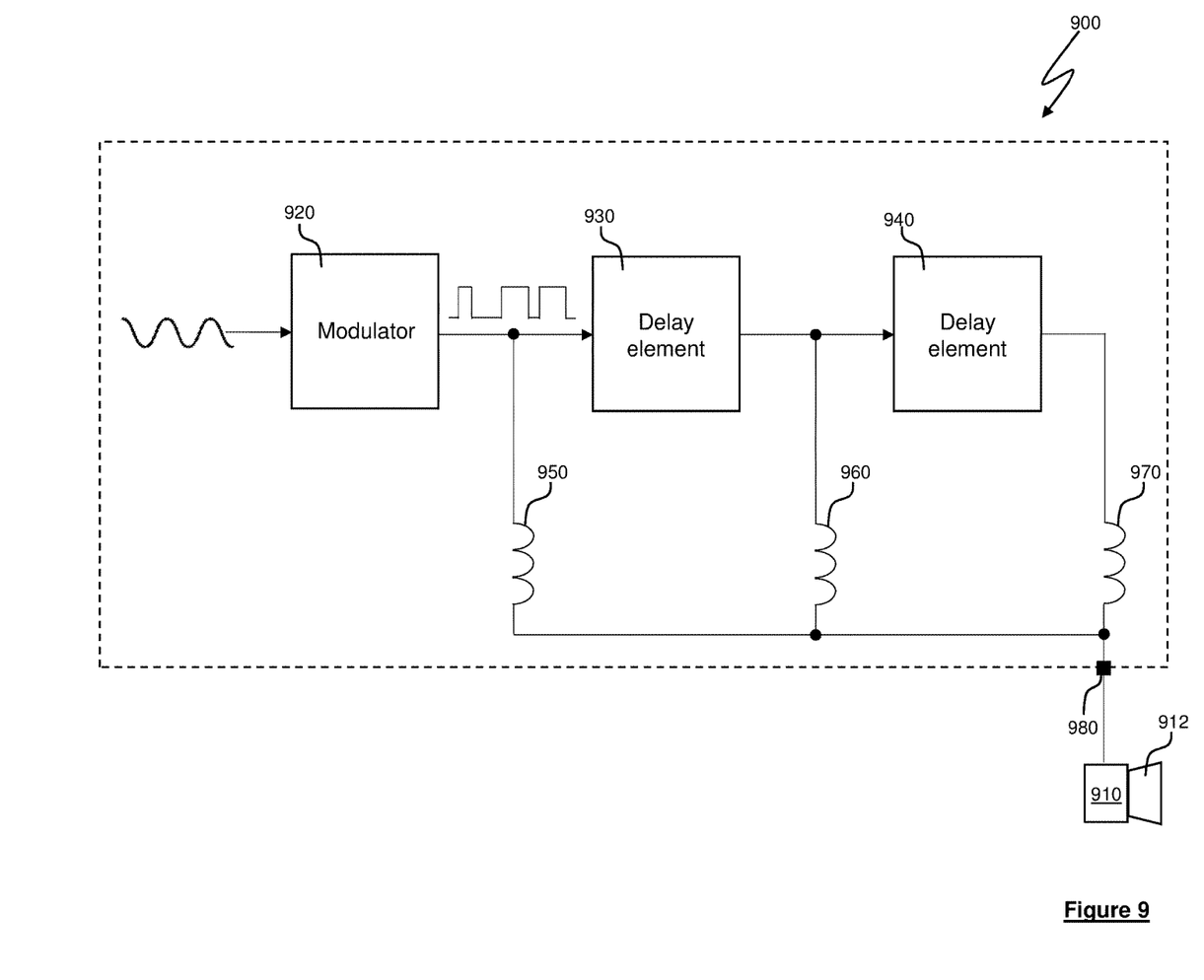
FIG. 9 is a schematic representation of a system for driving a single-coil loudspeaker.

FIG. 9 is a schematic representation of a system 900 for driving a single-coil loudspeaker 910.

The system 900 includes a modulator 920 which is configured to receive an analogue input signal such as an audio signal and convert it to a digital (e.g. PWM) output signal. The modulator 920 may be a class D modulator, and/or an asynchronous or self-oscillating PWM modulator for example. The modulator 920 may be implemented, for example, in circuitry (e.g. discrete circuitry or integrated circuitry) or by processing circuitry (e.g. a digital signal processor) executing appropriate software code.

An output of the modulator 920 is coupled to an input of a first delay element 930 such that the PWM signal output by the modulator 920 is input to the first delay element 930. The output of the modulator 920 is also coupled to a first terminal of a first inductor 950 of the system 900.

The first delay element 930 is configured to apply a delay to the input digital signal and to output a delayed version of the digital signal. An output of the first delay element 1930 is coupled to an input of a second delay element 940 such that the delayed version of the digital signal output by the first delay element 930 is input to the second delay element 940. The output of the first delay element 930 is also coupled to a first terminal of a second inductor 960.

The second delay element 940 is configured to apply a further delay to the input digital signal and to output a further delayed version of the digital signal. An output of the second delay element 940 is coupled to a first terminal of a third inductor 970.

The first and second delay elements may be implemented, for example, in discrete or integrated circuitry, or in processing circuitry executing suitable software code. Where the delay elements are implemented in integrated circuitry, they may be integrated with the modulator circuitry in a single integrated circuit (IC), or alternatively may be integrated together as a standalone IC. Alternatively, each delay element may be integrated as a separate IC.

Second terminals of the first, second and third inductors 950, 960, 970 are coupled together and to an output terminal or node 980 of the system 900, which is configured to be coupled to an input terminal of the loudspeaker 910. Thus the output terminal or node 980 provides an output node for a drive signal to drive the loudspeaker 910.

As will be appreciated by those skilled in the art, the combination of the first and second delay elements 930, 940, first, second and third inductors 950, 960, 970 and a cone 912 of the loudspeaker 910 acts as a FIR DAC (Finite Impulse Response Digital to Analogue Converter), as explained above with reference to FIG. 2.

The system 900 may be implemented as a single integrated circuit, in which case the inductors 950, 960, 970 may be embedded or on-chip inductors. Alternatively, the system 900 may be implemented as a module comprising one or more integrated circuits implementing the modulator 920 and delay elements 930, 940 mounted on a substrate such as a printed circuit board (PCB), with the inductors 950, 960, 970 also being mounted on the substrate externally of the integrated circuit(s). In some examples the loudspeaker 910 may also be mounted on the substrate so as to form part of the module. Alternatively, the loudspeaker may be provided separately and thus may not form part of the module.

Figure 10:
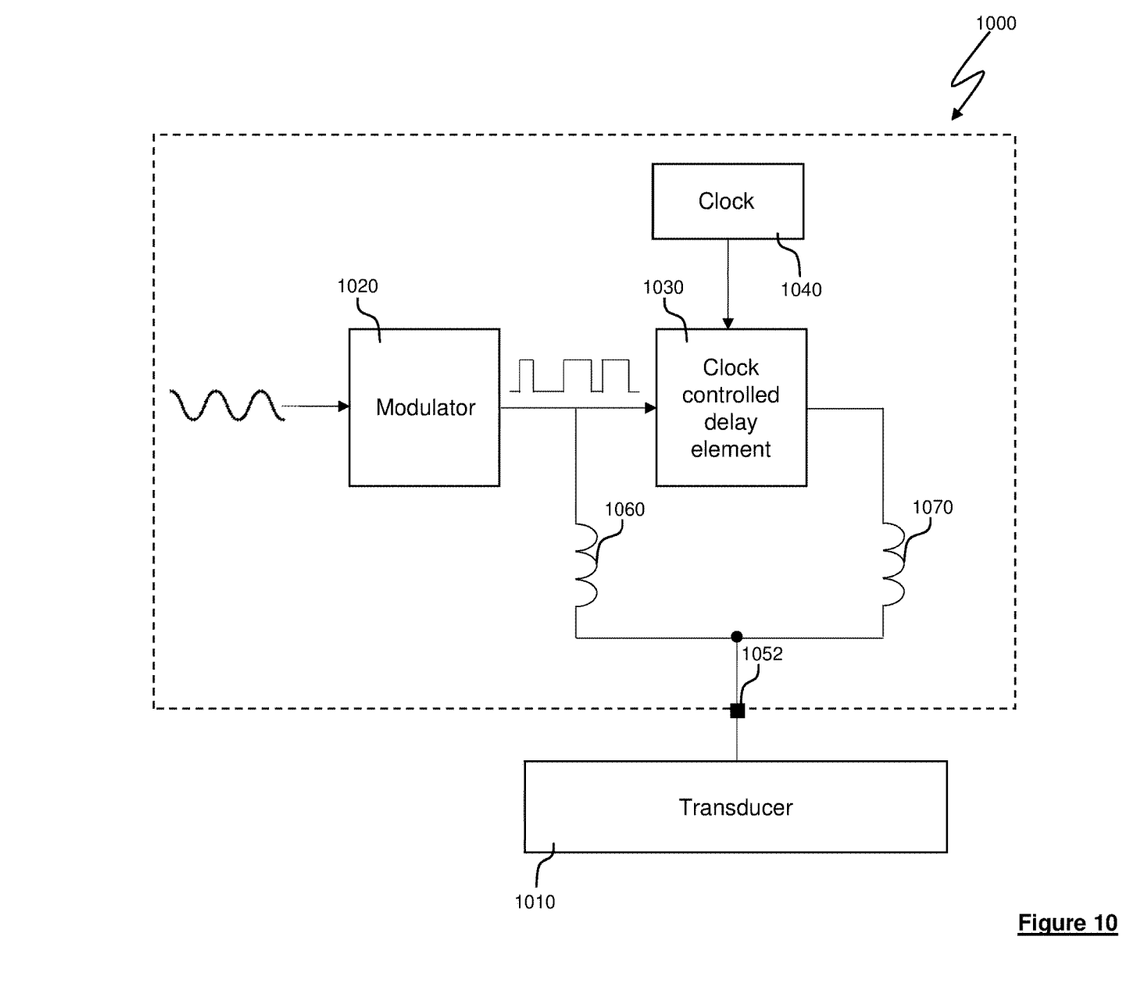
FIG. 10 is a schematic representation of a system for driving a single-coil transducer.

FIG. 10 is a schematic representation of a system for driving a single-coil transducer.

The system 1000 includes a modulator 1020 which is configured to receive an analogue input signal such as an audio signal and convert it to a digital output signal, e.g. a pulse width modulated (PWM) signal. The modulator 1020 may be, for example, an asynchronous or self-oscillating PWM modulator and/or a class D modulator, for example. The modulator 1020 may be implemented, for example, in circuitry (e.g. discrete circuitry or integrated circuitry) or by processing circuitry (e.g. a digital signal processor) executing appropriate software code.

An output of the modulator 1020 is coupled to an input of a clock controlled delay element 1030 such that the digital signal output by the modulator 1020 is input to the clock controlled delay element 1030. The output of the modulator 1020 is also connected to a first output terminal 1052 of the system 1000, which is configured to be coupled to a first terminal of a first inductor 1060.

The clock controlled delay element 1030 is configured to apply a delay to the input digital signal and to output a delayed version of the digital signal. The clock controlled delay element 1030 may comprise, for example, a clocked buffer or a digital delay element of the kind described above with reference to FIGS. 5 and 6.

An output of the clock controlled delay element 1030 is coupled to a second output terminal 1054 of the system 1000, which is configured to be coupled to a first terminal of a second inductor 1070.

Second terminals of the first and second inductors 1060, 1070 are coupled together and to an output terminal or node 1052 of the system 1000, which is configured to be coupled to an input terminal of the transducer 1010. Thus the output terminal or node 1052 provides an output node for a drive signal to drive the transducer 1010.

The clock controlled delay element 1030 may be implemented, for example, in discrete or integrated circuitry, or in processing circuitry executing suitable software code. Where the clock controlled delay element 1030 is implemented in integrated circuitry, it may be integrated with the modulator circuitry in a single integrated circuit (IC), or alternatively may be integrated together as a standalone IC. Alternatively, the clock controlled delay element 1030 may be integrated as a separate IC.

The system 1000 further includes a clock signal generator 1040, operative to generate and output a clock signal to the clock controlled delay element 1030.

In the example illustrated in FIG. 10, one clock controlled delay element 1030 is provided, but it will be appreciated that more a plurality of such delay elements could be provided, with an output of each delay element supplying a delayed version of the digital signal output by the modulator 1020 to a different inductor.

As will be appreciated by those skilled in the art, the combination of the clock controlled delay element 1030, the first and second inductors 1060, 1070 and the transducer 1010 acts as a FIR DAC (Finite Impulse Response Digital to Analogue Converter), in the manner described above with reference to FIG. 2.

The system 1000 may be implemented as an integrated circuit, in which case the inductors 1060, 1070 may be embedded or on-chip inductors. Alternatively, the system 1000 may be implemented as a module comprising one or more integrated circuits implementing the modulator 1020, clock controlled delay elements 1030 and clock 1040 mounted on a substrate such as a printed circuit board (PCB), with the inductors 1060, 1070 also being mounted on the substrate externally of the integrated circuit(s). In some examples the transducer 1010 may also be mounted on the substrate so as to form part of the module. Alternatively, the transducer 1010 may be provided separately and thus may not form part of the module.

Embodiments may be implemented in a range of applications and in particular are suitable for audio applications.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality. In some instances the device could be an accessory device such as a headset or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A system for driving a transducer, the system comprising:
  a modulator for outputting a digital output signal representative of a received analogue input signal at a modulator output;
  a delay element for applying a delay to the digital output signal to generate a first delayed signal at a delay element output;
  a first inductor having a first terminal coupled to the modulator output; and
  a second inductor having a first terminal coupled to the delay element output,
  wherein a second terminal of the first inductor is coupled to a second terminal of the second inductor to provide an output node for a drive signal to drive the transducer.

2. A system according to claim 1 wherein the first inductor and the second inductor comprise first and second coils of the transducer.

3. A system according to claim 1 wherein the transducer comprises a loudspeaker.

4. A module comprising the system of claim 1 and a transducer.

5. An integrated circuit comprising a system according to claim 1.

* * * * *